(12) United States Patent
Ventelae

(10) Patent No.: US 9,075,945 B1
(45) Date of Patent: Jul. 7, 2015

(54) METHOD FOR IMPLEMENTING EFFICIENT ENTROPY DECODER BY USING HIGH LEVEL SYNTHESIS

(71) Applicant: GOOGLE INC., Mountain View, CA (US)

(72) Inventor: Jaakko Tuomas Aleksi Ventelae, Oulu (FI)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/317,860

(22) Filed: Jun. 27, 2014

(51) Int. Cl.
*G06F 9/45* (2006.01)
*G06F 17/50* (2006.01)

(52) U.S. Cl.
CPC .................... *G06F 17/505* (2013.01)

(58) Field of Classification Search
USPC ........................ 716/101, 103, 104, 105, 106
See application file for complete search history.

(56) References Cited

U.S. PATENT DOCUMENTS

| | | | |
|---|---|---|---|
| 6,687,894 B2 | 2/2004 | Ohnishi et al. | |
| 7,743,352 B2 | 6/2010 | Ganai et al. | |
| 7,913,204 B2 | 3/2011 | Masuda | |
| 8,601,413 B2 | 12/2013 | Yasunaka | |
| 2008/0077906 A1* | 3/2008 | Bowyer et al. | 716/18 |
| 2009/0144690 A1* | 6/2009 | Spackman et al. | 716/18 |
| 2009/0235223 A1* | 9/2009 | Kakui et al. | 716/18 |

OTHER PUBLICATIONS

"Introduction to FPGA Design with Vivado High-Level Synthesis", XILINX, UG998 (v1.0), Jul. 2, 2013, 89 pages.
B. Le Gal, et al, "High-Level Synthesis Assisted Rapid Prototyping for Digital Signal Processing", IEEE International Conference on Microelectronics, 2004, 4 pages.
Casseau, et al, "C-Based Rapid Prototyping for Digital Signal Processing", Proc. of the 13th European Signal Processing Conference, 2005, 4 pages.
McFarland, et al, "Tutorial on High-Level Synthesis", 25th ACM/IEEE Design Automation Conference, 1988, 7 pages.

\* cited by examiner

*Primary Examiner* — Brian Ngo
(74) *Attorney, Agent, or Firm* — Brake Hughes Bellermann LLP

(57) ABSTRACT

A non-transitory computer-readable storage medium having stored thereon computer executable program code which, when executed on a computer system, causes the computer system to perform steps is disclosed. The steps include receiving a portion of a source code including a first program model defining an element of an integrated circuit, generating a first register-transfer level (RTL) description based on the portion of the source code, defining a library component based on the first RTL description, receiving the source code including a second program model defining the integrated circuit, replacing the portion of the source code corresponding to the first program model with the library component, and generating a second RTL description based on the source code.

19 Claims, 7 Drawing Sheets

METHOD FOR IMPLEMENTING EFFICIENT ENTROPY DECODER BY USING HIGH LEVEL SYNTHESIS

BACKGROUND

High level synthesis tools can create a register-transfer level (RTL) (e.g., VHDL/verilog/systemVerilog) code from high level source code (e.g., C, C++). High level synthesis makes testing and changing RTL hardware efficient because changes can be made into high level source code instead of rewriting RTL which is slow and error prone process. Arithmetic coding can be a complex element of modern video compression standards (e.g., VP8/VP9/HEVC/H264) and debugging/testing of arithmetic coding can be a tedious task if a hardware accelerator is implemented in RTL. To counter this problem high level synthesis is used. However, arithmetic coding can be very data dependent and non-linear algorithm high level synthesis tools can have problems while trying to generate the RTL code from the high level source code.

As a result, high level synthesis of a hardware accelerator typically fails because of failures in synthesizing the arithmetic coding. These failures result in excessive debugging/testing of hardware accelerator designs. Similar complex systems have corresponding drawbacks when sub-elements repeatedly fail during system synthesis resulting in excessive debugging/testing of the system.

SUMMARY

This disclosure relates to replacing a source code element corresponding to a hardware definition with a register-transfer level (RTL) definition synthesized from the source code prior to synthesizing source code for a system including the hardware definition.

In a general aspect, a non-transitory computer-readable storage medium having stored thereon computer executable program code which, when executed on a computer system, causes the computer system to perform steps is disclosed. The steps include receiving a portion of a source code including a first program model defining an element of an integrated circuit, generating a first register-transfer level (RTL) description based on the portion of the source code, defining a library component based on the first RTL description, receiving the source code including a second program model defining the integrated circuit, replacing the portion of the source code corresponding to the first program model with the library component, and generating a second RTL description based on the source code.

In another general aspect, a high-level synthesis (HLS) tool configured to generate a register-transfer level (RTL) description of an integrated circuit is disclosed. The HLS includes a library processing module configured to define a library component based on a first RTL defining an element of the integrated circuit and a synthesis module. The synthesis module is configured to replace a portion of a source code corresponding to a first program model with the library component, the source code defining the integrated circuit and generate the RTL description of the integrated circuit based on the source code.

In yet another general aspect, a method for designing an integrated circuit using a high-level synthesis (HLS) tool is disclosed. The method includes defining a library component based on a first register-transfer level (RTL) configured to define an element of the integrated circuit, replacing a portion of a source code corresponding to a first program model with the library component, the source code defining the integrated circuit, and generating a second RTL description representing the integrated circuit based on the source code.

DETAILED DESCRIPTION OF THE EMBODIMENTS

Figure 1:
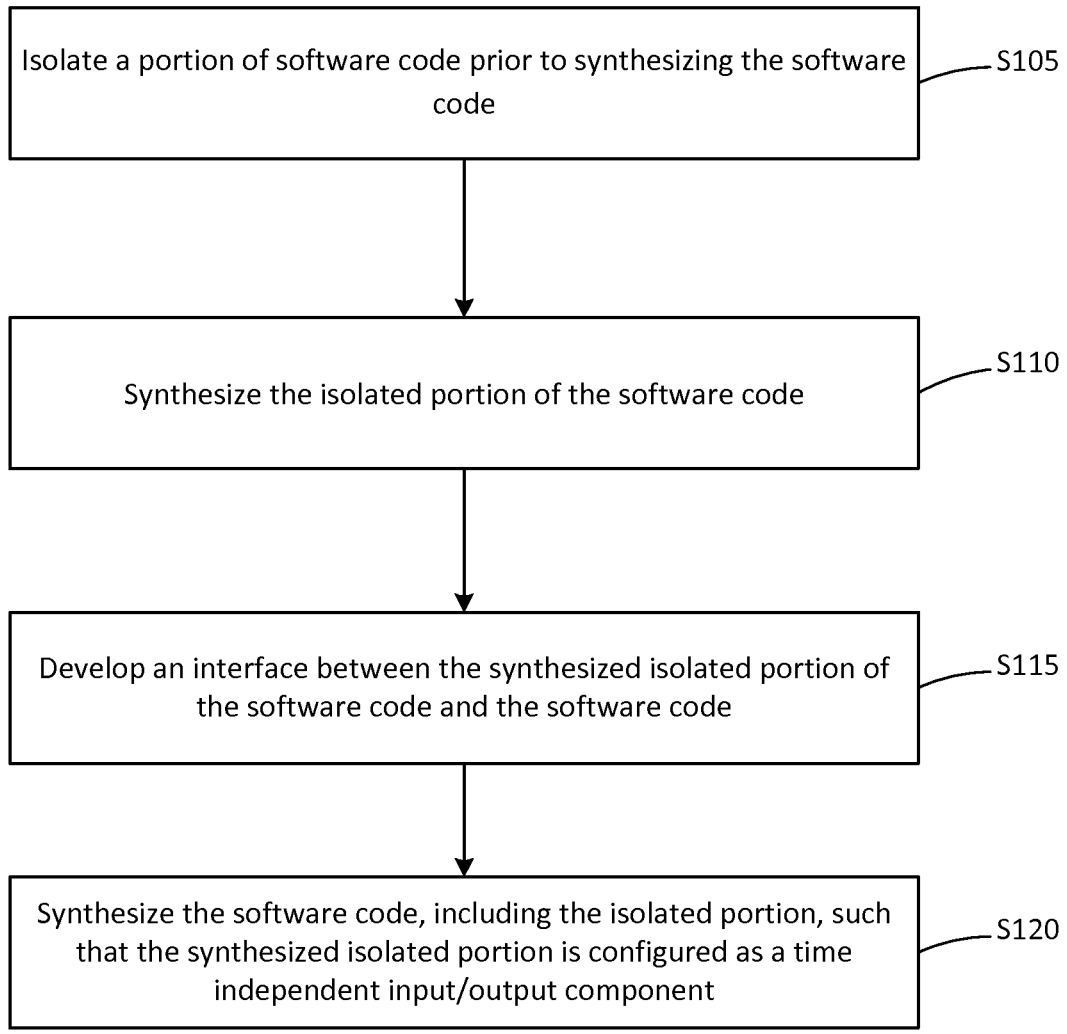
FIG. 1 is a flowchart of a method for synthesizing software code representing hardware according to at least one example embodiment.

While example embodiments may include various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims.

Furthermore, the figures are intended to illustrate the general characteristics of methods and/or structure utilized in certain example embodiments and to supplement the written description provided below. These figures are not, however, to scale and may not precisely reflect the precise structural or performance characteristics of any given embodiment, and should not be interpreted as defining or limiting the range of values or properties encompassed by example embodiments. For example, the structural elements may be reduced or exaggerated for clarity. The use of similar or identical reference numbers in the various drawings is intended to indicate the presence of a similar or identical element or feature.

Figure 5:
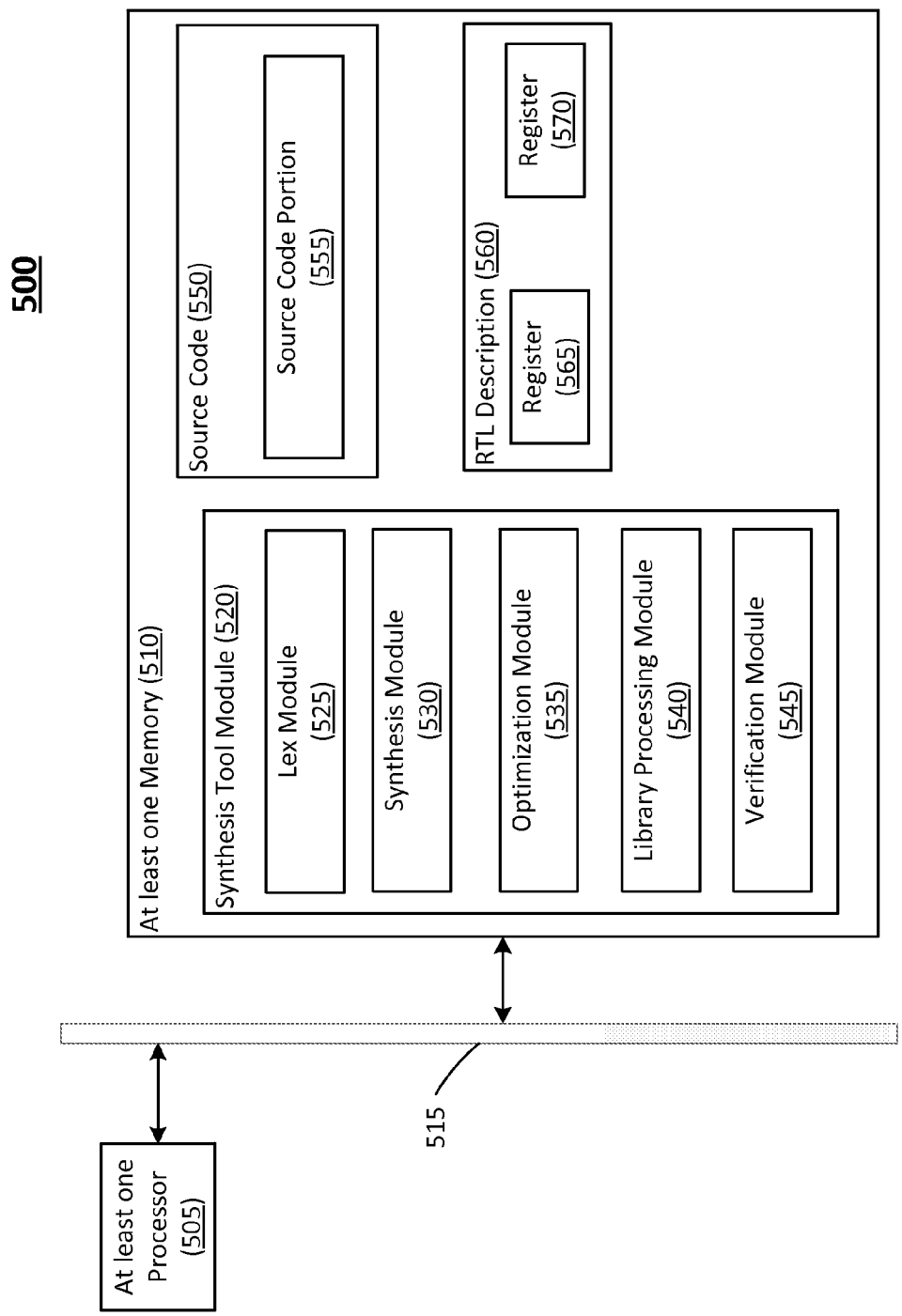
FIG. 5 is a block diagram of a system according to at least one example embodiment.
Figure 6:
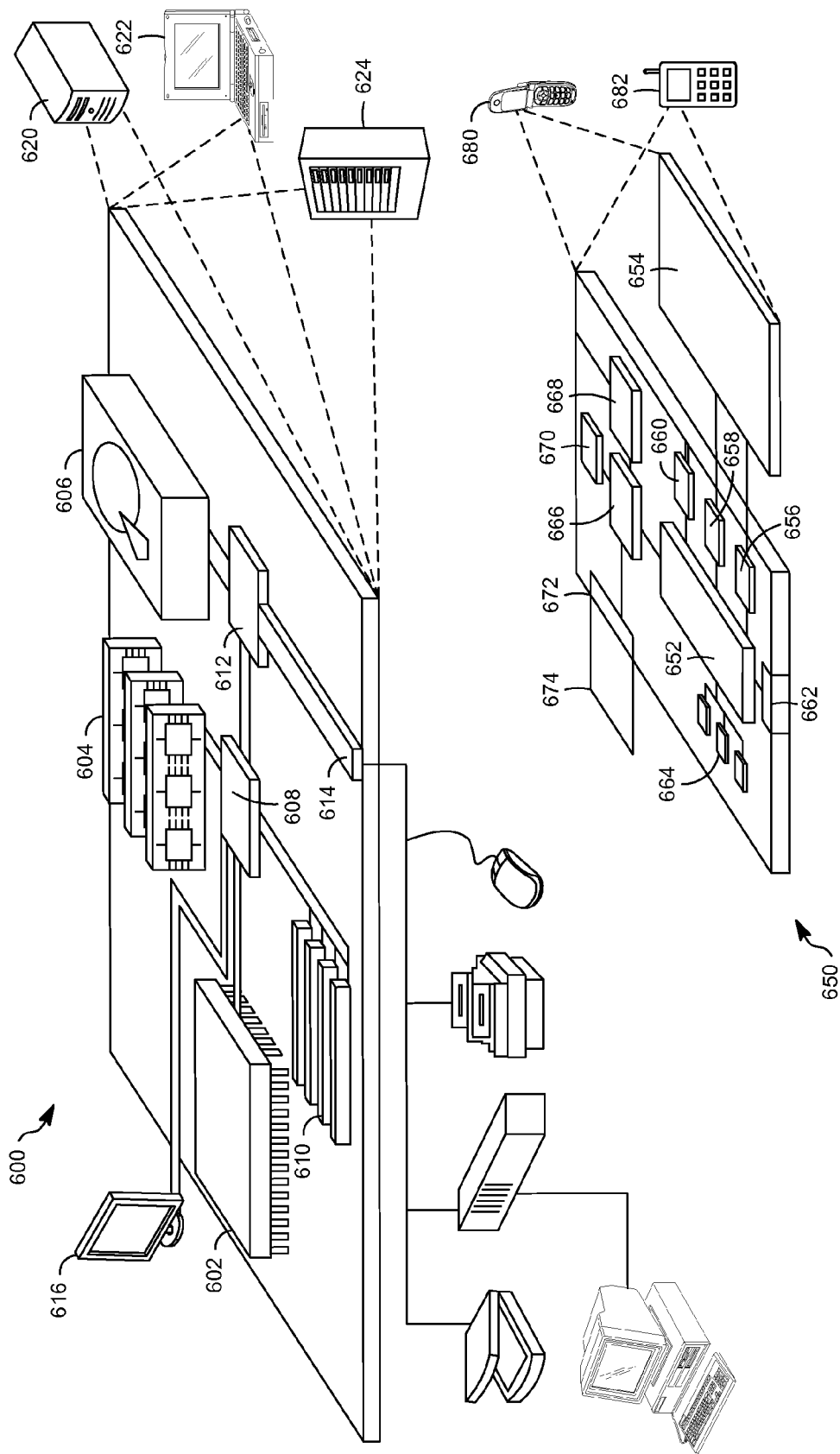
FIG. 6 is a schematic block diagram of a computer device and a mobile computer device that can be used to implement the techniques described herein.

FIG. 1 is a flowchart of a method for synthesizing software code representing hardware according to at least one example embodiment. The steps described with regard to FIG. 1 may be performed due to the execution of software code stored in a memory (e.g., at least one memory 510 and/or 604) associated with an apparatus (e.g., as shown in FIGS. 5 and 6) and executed by at least one processor (e.g., at least one processor 505 and/or 602) associated with the apparatus. However, alternative embodiments are contemplated such as a system embodied as a special purpose processor. Although the steps described below are described as being executed by a processor, the steps are not necessarily executed by a same processor. In other words, at least one processor may execute the steps described below with regard to FIG. 1.

Further, the steps described below may be described with regard to an example implementation of a decoder or entropy decoder. However, example embodiments are not limited thereto. For example, the techniques described may be used to synthesize a description/design for any integrated circuit or ASICs (application specific integrated circuits). Accordingly, the techniques described herein may be used to when designing an encoder as well as a decoder. Synthesis may be the process of transforming a digital system from a behavioral specification to a structure configured to implement the behavior. The behavioral specification may be developed using a higher level source code (e.g., C, C++). The structure may be a register-transfer level (RTL) description which defines hardware (e.g., registers) and the data flow between registers. By contrast compiling software code uses a compiler that compiles a source code (e.g., C, C++) description into assembly code that runs on a targeted processor (e.g., X86).

As shown in FIG. 1, in step S105 a portion of a software code is isolated prior to synthesizing the software code. Isolating software code may include identifying software code that performs a specific function or group of functions and removing that code from a software system that uses the function or group of functions. For example, the portion of software code may be associated with a complex or processing intensive synthesis. In other words, the portion of software code may be prone to coding errors and may be time consuming to synthesize. The portion of software code itself may define a model associated with an integrated circuit or ASIC. Alternatively, the portion of software code itself may define a model associated with an element of and/or a subcomponent of an integrated circuit or ASIC.

Therefore, isolating the portion of software code may allow a developer and/or hardware designer to use a synthesis tool(s) on the isolated portion of software code. Accordingly, in step S110 the isolated portion of the software code is synthesized. In one example implementation, the isolated portion of software code may be read (e.g., from a memory) by the synthesis tool. Then the synthesis tool may be utilized to synthesize the isolated portion of software code. Synthesizing the isolated portion of software code may include generating a register-transfer level (RTL) description of an integrated circuit defined by the isolated portion of software code.

In step S115 an interface between the synthesized, isolated portion of the software code and the software code is developed. For example, the interface may be an input/output (I/O) interface. In other words, the interface may be configured to receive an input (e.g., data, a signal, a bit, a bit stream, a byte, a register value, and the like). The interface may be configured to communicate an output (e.g., data, a signal, a bit, a bit stream, a byte, a register value, and the like). The interface may be a software interface (e.g., a memory read/write) and/or a hardware interface (e.g., a pin layout or a bus interconnection).

In step S120 the software code, including the isolated portion, is synthesized such that the synthesized, isolated portion is configured as a time independent input and/or time independent output component. For example, using the synthesis tool the synthesized isolated portion of software code may be integrated with the software code. Integration may include replacing the isolated portion of software code with the synthesized isolated portion of software code. Integration may include configuring the interface and/or the software code (e.g., using the synthesis tool) to enable communication between the software code with the synthesized isolated portion of software code. In an example implementation when the software code communicates with the synthesized isolated portion of software code, the software code utilizes the interface. Accordingly, the communication may be time independent (e.g., occur within one clock cycle). In other words, the output is generated (and written) in the same clock cycle as the input is received (and read).

Accordingly, example embodiments allow a developer to synthesize and troubleshoot a complex element (e.g., an algorithm) of a behavioral specification and then replace the complex element in the behavioral specification with a RTL definition. The RTL definition should return a result in the same clock cycle as it receives an input during a synthesis of the behavioral specification. Accordingly, a developer can focus on the system behavior knowing the complex element works as desired.

Figure 2:
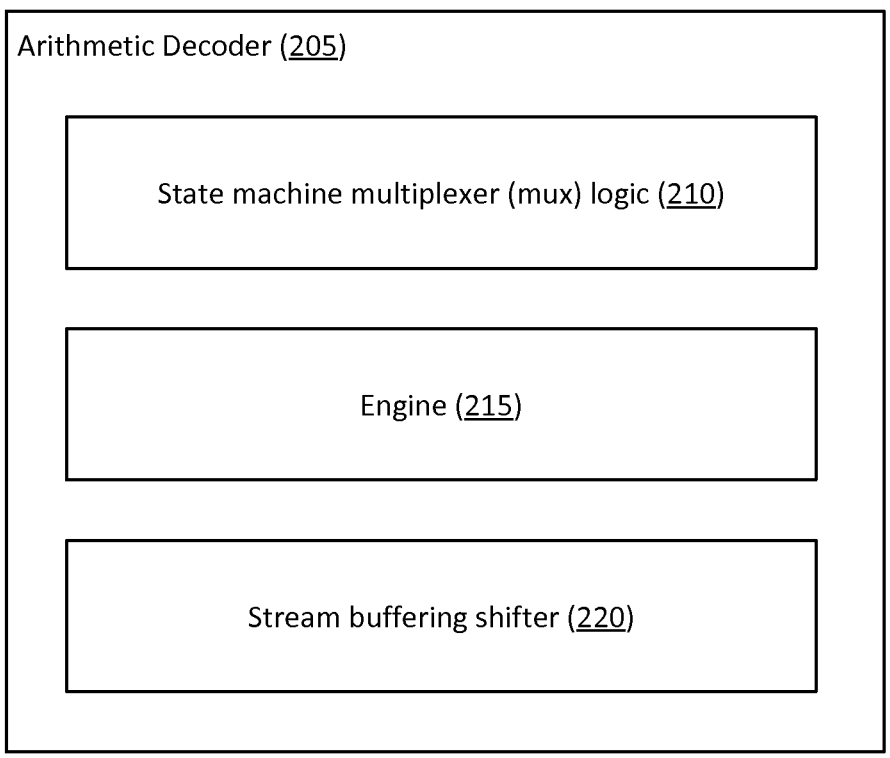
FIGS. 2, 3A and 3B illustrate block diagrams of an arithmetic decoder system according to at least one example embodiment.
Figure 3A:
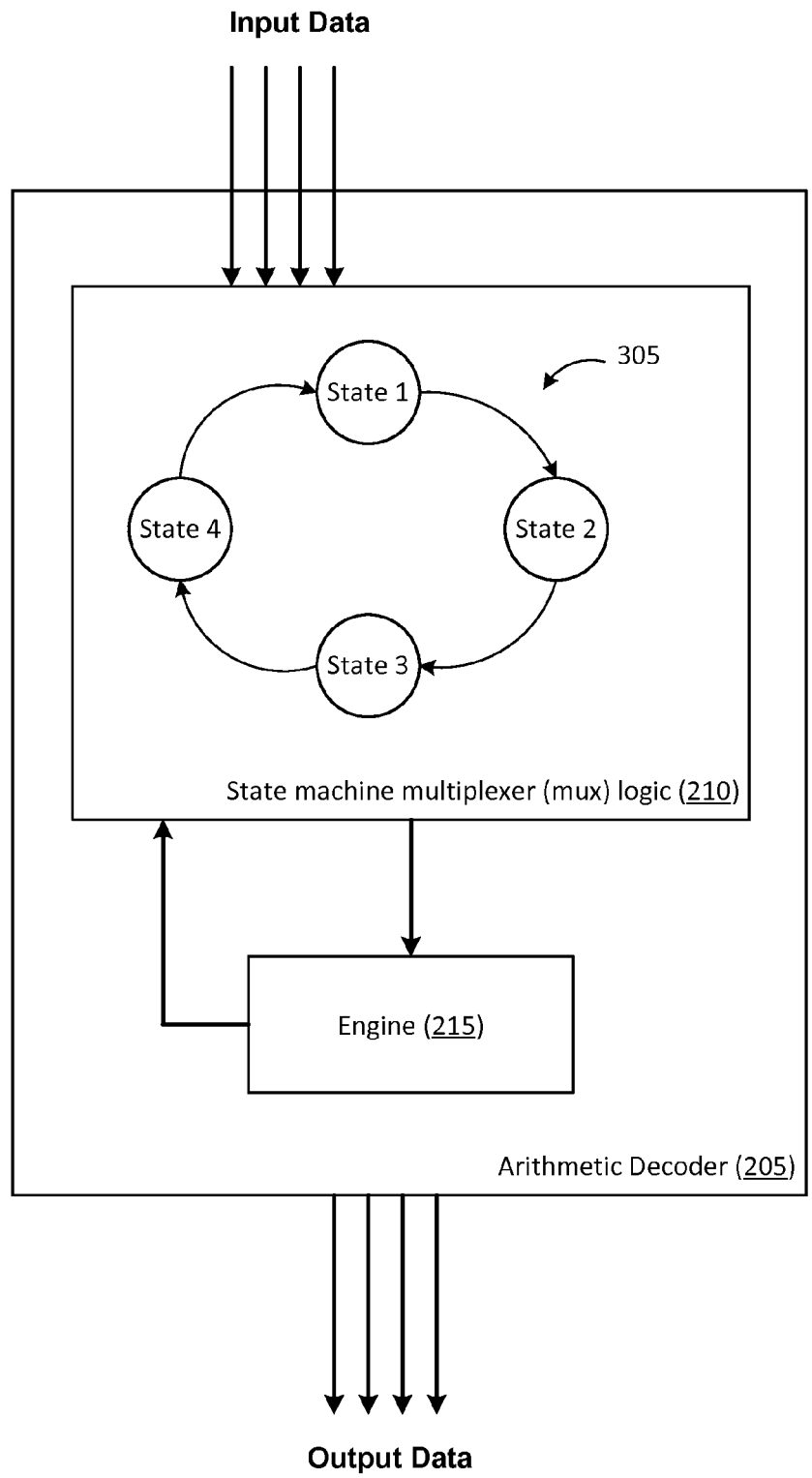
Figure 3B:
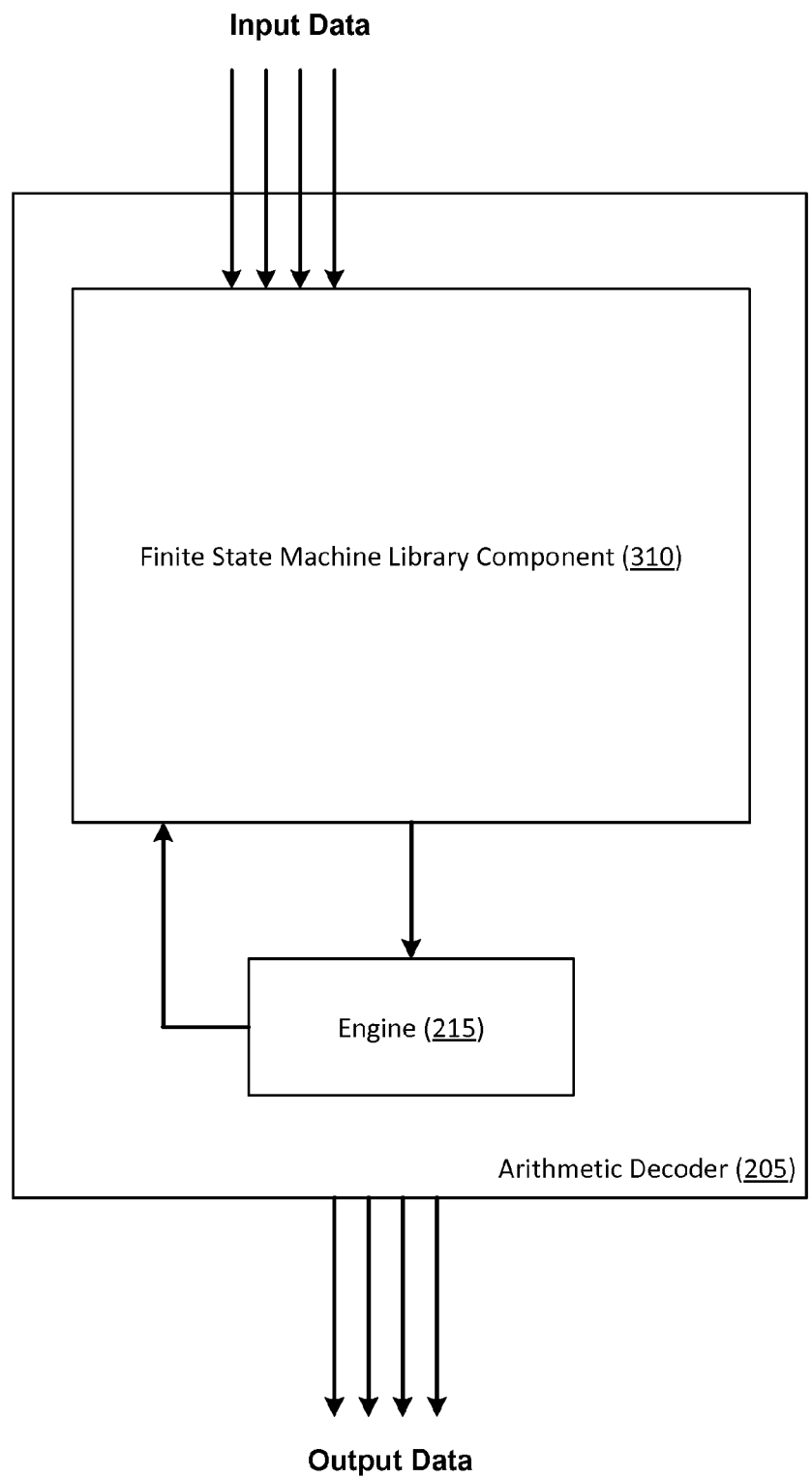

FIGS. 2, 3A and 3B illustrate block diagrams of an arithmetic decoder system according to at least one example embodiment. As shown in FIG. 2, an arithmetic decoder 205 includes state machine multiplexer (mux) logic 210, an engine 215, and a stream buffering shifter 220.

The state machine mux logic 210 is configured to select at least one output value based on at least one input value. In an example implementation, the state machine mux logic 210 may be implemented as a state machine or finite state machine (FSM). Accordingly, the output value may be determined based on a present state and the input value. Upon triggering a clock, the FSM switches to a new state that includes the output value. The FSM may be implemented in software or hardware. For example, the FSM may be implemented as a set of instructions for a microprocessor. For example, the FSM circuit may consist of several flip-flops configured to hold the previous state, and several decoding logic gates configured to receive the input. The output state or signal may be dependent upon both the previous state and the input at the time the flip-flops are clocked. The FSM may be fixed in that each time the FSM is in a particular state and receives a particular input, then the output state signal should be the same.

The engine 215 is configured to perform video decompression. For example, the engine 215 may be a processor specifically configured to perform video decompression. The engine 215 may perform decompression from the picture layer down. For example, the engine 215 may perform decompression of the picture layer, slice layer, macroblock layer and block layer. In other words, the engine may be programmed to decode (decompress) on a frame by frame basis and execute the variable length decoding starting at the picture layer, Inverse Zig-Zag, Inverse Quantization and Inverse Discrete Cosine Transform, and frame reconstruction (motion vector compensation) on a block by block basis until the end of a picture. The engine 215 is configured to generate decoded bins that are used as input to the state machine mux logic 210.

The stream buffering shifter 220 is configured to be the cache of the code stream loaded to the engine 215. For example, the stream buffering shifter 220 may store a decoded/decompressed code stream received from the state machine mux logic 210. An output of the stream buffering shifter 220 may be an output of the arithmetic decoder 205.

As shown in FIG. 3A, the state machine mux logic 210 further includes a plurality of state machines 305 (shown as state 1, state 2, state 3 and state 4). As discussed above, each of the plurality of state machines 305 may include an output state or signal that may be dependent upon both a previous state and an input that changes when the state machine mux logic 210 is clocked. The plurality of state machines may be modeled using an RTL description. Accordingly, the plurality of state machines 305 may be synthesized from higher level source code (e.g., C, C++) using a high-level synthesis (HLS) tool (Catapult-C(Calypto), AccelFPGA, (AccelChip), SystemC Compiler (Synopsys) for commercials and GAUT, SPARK, Cathedral, and the like).

HLS tools generate an RTL description for an architecture based on designer and system constraints. The RTL description should be reliable (e.g., without error) as compared to a hand coded design (e.g., coding directly in RTL). In other words, HLS tools can speed up design time versus register transfer level hand coding. High-level synthesis may be analogous to software compilation transposed to the hardware domain. The source specification is written in a high-level language (e.g., Matlab, C, C++, and the like) that models the algorithmic behavior of a complex hardware component. An automatic refinement process allows the mapping of the described behavior onto a specific technology target depending of targeted constraints.

Accordingly, the plurality of state machines 305 may be the result (e.g., an RTL definition) of a synthesis of source code written in a high-level language. For example, an algorithm utilizing a loop and/or a case statement may be synthesized into the plurality of state machines 305. One of the aforementioned constraints may be that when a state machine is in a particular state and receives a particular input, then the output state signal should be the same for each of the plurality of state machines 305. In addition the architecture may include one or more flip flops.

In the case of a conditional statement, HLS may create all or at least a portion of the circuits described by each branch of the conditional statement. Therefore, the runtime execution of a conditional software statement involves the selection between two possible results (e.g., states). When the HLS tool synthesizes the source code into the RTL description a significant number of branches may be generated. Should a branch fail, synthesis may fail. Further, the HLS tool may not necessarily produce the best/optimal result (e.g., follow the optimal branch). Further, the plurality of state machines 305 may correspond to a FSM. Therefore, a number of the branches may not correspond to a state within the FSM. Accordingly, the source code may need to be troubleshot and/or a non-optimum result removed before initiating a new synthesis. Further, a non-linear algorithm poses additional complexity because the HLS tool may attempt to fit the non-linear algorithm into a linear (or approximate linear) definition.

Therefore, in example implementations the plurality of state machines 305 may be separately synthesized. As shown in FIG. 3B, the state machine mux logic 210 is replaced in the arithmetic decoder 205 by a finite state machine library component 310. The finite state machine library component 310 may be based on an RTL definition of an isolated synthesis of source code representing the state machine mux logic 210. The finite state machine library component 310 may include an associated input hardware interface. The input hardware interface may be defined in a high level programming language. The finite state machine library component 310 may include an associated output hardware interface. The output hardware interface may be defined in the high level programming language. The input/output hardware interface may be associated with a bus and/or a pin location of an IC or ASIC. The input/output hardware interface may be configured to generate an output in a same clock cycle as a received input during the generation of the RTL description of the IC or ASIC by the HLS tool while synthesizing source code associated with the arithmetic decoder 205.

Alternatively (or in addition to), the finite state machine library component 310 may include an associated software input interface. The software input interface may be configured to map at least one input variable to a memory location (e.g., register 565). The finite state machine library component 310 may include an associated software output interface configured to map at least one output variable to a memory location. The input/output software interface may be associated with register locations and/or pointers to memory locations and have corresponding read/write methods. The input/output software interface may be configured to generate an output in a same clock cycle as a received input during the generation of the RTL description of the IC or ASIC by the HLS tool. In other words, the input/output software interface may be configured to write an output to a memory location in a same clock cycle as reading an input from another memory location (e.g., register 570) when the HLS tool is synthesizing source code associated with the arithmetic decoder 205.

Figure 4:
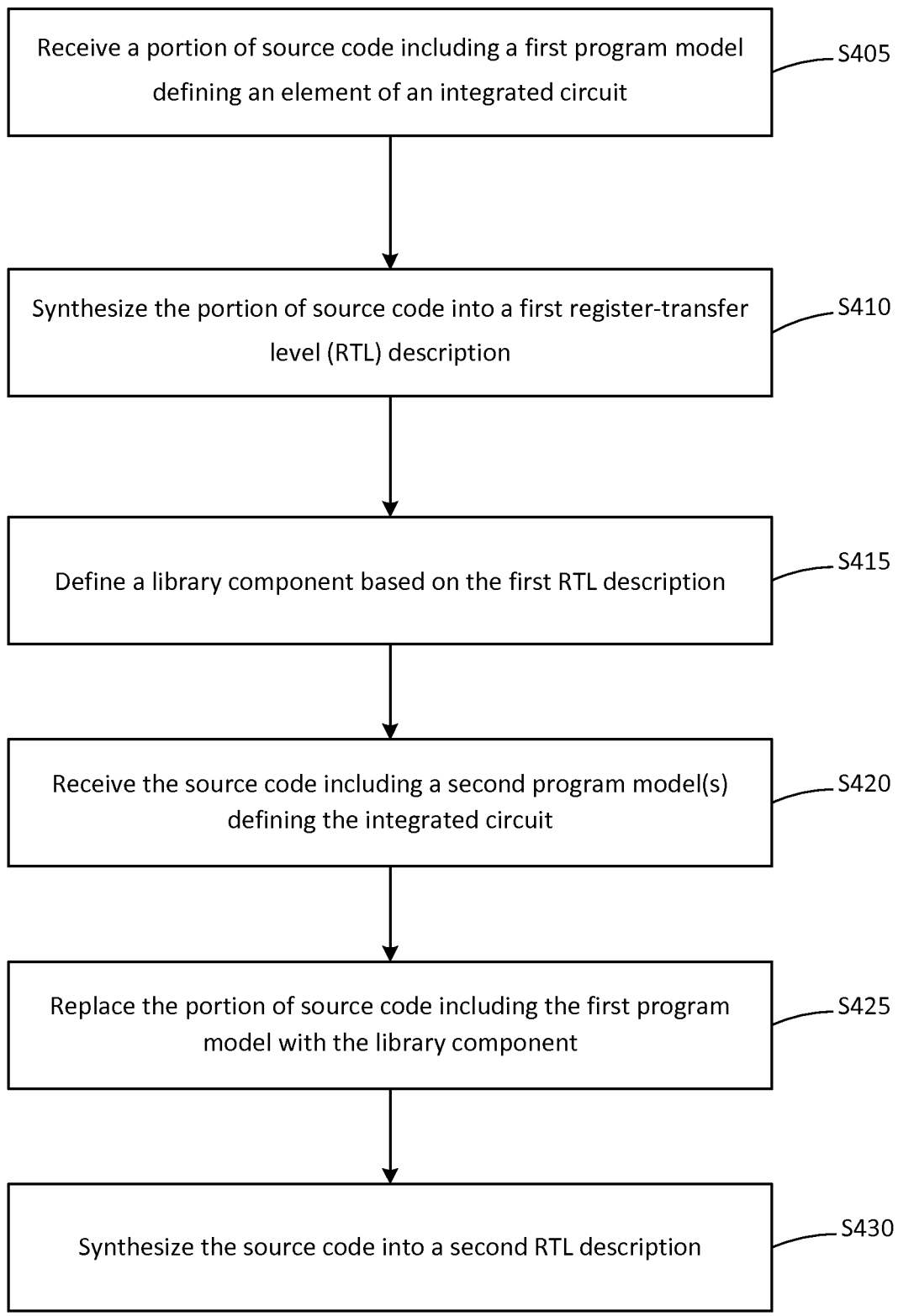
FIG. 4 is a flowchart of a method for synthesizing software code representing hardware according to at least one example embodiment.

FIG. 4 is a flowchart of a method for synthesizing software code representing hardware according to at least one example embodiment. The steps described with regard to FIG. 4 may be performed due to the execution of software code stored in a memory (e.g., at least one memory 510 and/or 604) associated with an apparatus (e.g., as shown in FIGS. 5 and 6) and executed by at least one processor (e.g., at least one processor 505 and/or 602) associated with the apparatus. However, alternative embodiments are contemplated such as a system embodied as a special purpose processor. Although the steps described below are described as being executed by a processor, the steps are not necessarily executed by a same processor. In other words, at least one processor may execute the steps described below with regard to FIG. 4.

Further, the steps described below may be described with regard to an example implementation of a decoder or entropy decoder. However, example embodiments are not limited thereto. For example, the techniques described may be used to synthesize a description/design for any integrated circuit or ASICs (application specific integrated circuits).

As shown in FIG. 4, in step S405 a portion of source code, including a first program model defining an element of an integrated circuit is received. For example, an HLS tool may read a portion of code representing a FSM from a memory location. The HLS tool may read code representing the state machine mux logic 210 associated with the arithmetic decoder 205. Alternatively, the HLS tool may read all of the source code associated with the arithmetic decoder 205 and separate/isolate the source code associated with the state machine mux logic 210 from the arithmetic decoder 205.

In step S410 the portion of source code is synthesized into a first register-transfer level (RTL) description. Synthesizing the portion of source code may include generating a register-transfer level (RTL) description of an integrated circuit defined by the portion of source code. For example, the RTL description of the portion of source code may define an element of an entropy decoder, which may or may not be an element of a larger integrated circuit (e.g., a video decoder). In an example implementation, the RTL description of the isolated portion of software code may define an arithmetic decoder and/or an element or subcomponent thereof (e.g., a state machine).

For example, the HLS tool may synthesize the read portion of code representing the FSM. Synthesizing the portion of source code may include optimizing the resultant RTL description for, as an example, chip size, speed, clock rate, and the like. Synthesizing the source code may include modifying the resultant RTL code by, for example, mapping a number of states to a same or default state. The mapping may be based on a designer's knowledge of a standard (e.g., a video encoding standard).

In an example implementation, the first RTL description is compared to a design specification of at least one of the element of the integrated circuit and the integrated circuit. In an example implementation, the RTL description is tested or bench tested. Testing the RTL description may include first simulating the program model (e.g., representing the FSM) based on the portion of the source code in a high level language, second simulating the program model based on the first RTL description and comparing an output of the first simulating to an output of the second simulating.

In step S415 a library component based on the first RTL description is defined. For example, the synthesized portion of code representing the FSM can be added to an existing library or used as an initial element of a new code library. An interface may be associated with the library component. For example, the interface may be an input/output (I/O) interface. In other words, the interface may be configured to receive an input (e.g., data, a signal, a bit, a bit stream, a byte, a register value, and the like). The interface may be configured to communicate an output (e.g., data, a signal, a bit, a bit stream, a byte, a register value, and the like). The interface may be a software interface (e.g., a memory read/write) and/or a hardware interface (e.g., a pin layout or a bus interconnection). The library component may be the finite state machine library component 310.

In step S420 the source code, including a second program model (or models) defining the integrated circuit, is received. For example, the HLS tool may read all of the source code associated with the arithmetic decoder 205.

In step S425 the portion of source code including the first program model is replaced with the library component. For example, the HLS tool may replace the source code associated with the state machine mux logic 210 with the finite state machine library component 310. Replacing the source code may include linking an interface associated with the library component with the source code. For example, an I/O interface associated with the finite state machine library component 310 may be linked to the source code associated with the arithmetic decoder 205 in the HLS tool.

In step S430 the source code is synthesized into a second RTL description. For example, the HLS tool may synthesize the source code associated with the arithmetic decoder 205 including the finite state machine library component 310. In an example implementation, during the synthesis of source code into the second RTL description, the finite state machine library component 310 may generate an output in a same clock cycle as a received input via the I/O interface. For example, the finite state machine library component 310 may write an output to a first memory location in a same clock cycle as reading an input from a second memory location.

FIG. 5 is a block diagram of a system according to at least one example embodiment. As shown in FIG. 5, the system (or apparatus) 500 includes at least one processor 505 and at least one memory 510. The at least one processor 505 and the at least one memory 510 are communicatively coupled via bus 515. The system 500 may be, for example, an element of a computing device (e.g., a cloud computing device or a server).

In the example of FIG. 5, the system 500 may be at least one computing device and should be understood to represent virtually any computing device configured to perform the methods described herein. As such, the system 500 may be understood to include various standard components which may be utilized to implement the techniques described herein, or different or future versions thereof. By way of example, the system 500 is illustrated as including the at least one processor 505 (e.g., a silicon based processor), as well as the at least one memory 510 (e.g., a non-transitory computer readable storage medium) respectively.

Thus, as may be appreciated, the at least one processor 505 may be utilized to execute instructions stored on the at least one memory 510, so as to thereby implement the various features and functions described herein, or additional or alternative features and functions. Of course, the at least one processor 505 and the at least one memory 510 may be utilized for various other purposes. In particular, it may be appreciated that the at least one memory 510 may be understood to represent an example of various types of memory and related hardware and software which might be used to implement any one of the modules described herein. Systems and/or methods described below may include data and/or storage elements. The data and/or storage elements (e.g., data base tables) may be stored in, for example, the at least one memory 510.

As shown in FIG. 5, the at least one memory 510 includes a synthesis tool module 520, source code block 550 and an RTL description block 560. The synthesis tool module 520 includes a lexical (lex) module 525, a synthesis module 530, an optimization module 535, a library processing module 540, and a verification module 545.

The synthesis tool module 520 may be configured to synthesize source code written in a high level programming language (e.g., C, C++, and/or the like). The synthesis tool module 520 may be the HLS tool described above. The synthesis tool module 520 may be configured to perform one or more of the functions/steps described above. For example, the synthesis tool module 520 may be configured to define a library component based on a first register-transfer level (RTL) configured to define an element of an integrated circuit and replace a portion of a source code corresponding to a first program model with the library component, the source code defining the integrated circuit.

The source code block 550 may be configured to store source code (or portions thereof) a high level programming language (e.g., C, C++, and/or the like). The source code may define an element of an integrated circuit (e.g., as source code portion 555), an entire integrated circuit (e.g., ASIC) and/or multiple integrated circuits. The source code may be based on a program model for, as an example, a standard (e.g., a video codec standard). The RTL description block 560 may be configured to store RTL descriptions of synthesized source code including memory configured to simulate registers 565, 570 of a software interface discussed in more detail above.

The lex module 525 may be configured to receive the source code as input (e.g., as a string of characters) and generate a sequence of symbols tokens. A token is a group of characters having collective meaning (e.g., a word or punctuation mark). The lex module 525 may eliminate comments and white spaces in the form of blanks, tab and newline characters. The lex module 525 may correlate errors messages from the synthesis module 530 with the source code (e.g., keep track of the number of lines). When an error is found, the lex module 525 may stop processing. Therefore, in example implementations, first synthesizing a complex element of hardware (e.g., arithmetic coding as an element of video compression codec) can allow any debugging of lexical errors associated with source code for the complex element of hardware.

The synthesis module 530 may be configured to generate a register-transfer level (RTL) definition based on the high level programming language (e.g., C, C++, and/or the like) source code. The optimization module 535 may be configured to optimize a size (e.g., smaller may be better) or layout (e.g., to fit on a standard chip) of a resultant IC. The optimization module 535 may be configured to optimize a temperature profile. For example, heat generating components may be spread out in a layout. The optimization module 535 may be configured to optimize memory availability. For example, additional memory may be added to an RTL definition. Optimization may include hand coding an RTL definition.

The library processing module 540 may be configured to store at least one library component that can be linked to source code during source code synthesis. Each library component may include an associated interface. For example, the interface may be an input/output (I/O) interface as described in more detail above. The verification module 545 may be configured to verify the operation of a synthesized RTL definition. In an example implementation, verifying the operation of a synthesized RTL definition may include testing or bench testing. Testing the RTL description may include first simulating a program model representing the source code or portion of the source code in a high level language, second simulating the program model based on the RTL description and comparing an output of the first simulating to an output of the second simulating.

As will be appreciated, the system 500 illustrated in FIG. 5 may be implemented as an element of and/or an extension of the generic computer device 600 and/or the generic mobile computer device 650 described below with regard to FIG. 6. Alternatively, or in addition to, the system 500 illustrated in FIG. 5 may be implemented in a separate system from the generic computer device 600 and/or the generic mobile computer device 650 having some or all of the features described below with regard to the generic computer device 600 and/or the generic mobile computer device 650. Alternatively, or in addition to, the system 500 illustrated in FIG. 5 in a separate system from the generic computer device 600 and/or the generic mobile computer device 650 and used to design and/or develop a component (e.g., video decoder) of the generic computer device 600 and/or the generic mobile computer device 650.

FIG. 6 is a schematic block diagram of a computer device and a mobile computer device that can be used to implement the techniques described herein. FIG. 6 is an example of a generic computer device 600 and a generic mobile computer device 650, which may be used with the techniques described here. Computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing partitions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 600, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provide in communication with processor 652, so as to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provide as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Partitions of the above example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative embodiments, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example embodiments are typically encoded on some form of non-transitory program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A non-transitory computer-readable storage medium having stored thereon computer executable program code which, when executed on a computer system, causes the computer system to perform steps comprising:
   receive by a synthesis tool module, a portion of a source code including a first program model defining an element of an integrated circuit;
   generate a first register-transfer level (RTL) description based on the portion of the source code;
   define a library component based on the first RTL description, the library component including:
      an input interface associated with the element of the integrated circuit, the input interface being configured to map at least one input variable to a first memory location, and
      an output interface associated with the element of the integrated circuit, the output interface being configured to map at least one output variable to a second memory location;
   receive the source code including a second program model defining the integrated circuit;
   replace the portion of the source code corresponding to the first program model with the library component; and
   generate a second RTL description based on the source code.

2. The non-transitory computer-readable storage medium of claim 1, wherein the first program model defines a state machine including multiplexer logic.

3. The non-transitory computer-readable storage medium of claim 1, wherein the first program model defines an arithmetic decoder.

4. The non-transitory computer-readable storage medium of claim 1, wherein the generating of the first RTL description includes:
   first simulating the first program model based on the portion of the source code in a high level language;
   second simulating the first program model based on the first RTL description; and
   comparing an output of the first simulating to an output of the second simulating.

5. The non-transitory computer-readable storage medium of claim 1, the generating of the first RTL description includes comparing the first RTL description to a design specification of at least one of the element of the integrated circuit and the integrated circuit.

6. The non-transitory computer-readable storage medium of claim 1, wherein
   the input interface and the output interface are hardware interfaces defined by a high level programming language.

7. The non-transitory computer-readable storage medium of claim 1, wherein during the generating of the second RTL description, the library component generates an output in a same clock cycle as a received input.

8. The non-transitory computer-readable storage medium of claim 1, wherein during the generating of the second RTL description, the library component writes an output to a first memory location in a same clock cycle as reading an input from a second memory location.

9. The non-transitory computer-readable storage medium of claim 1, wherein during the generating of the second RTL description, the library component receives an input based on a synthesizing of the second program and generates a time independent output based on the input.

10. A high-level synthesis (HLS) tool stored on a non-transitory computer-readable storage medium and executed by a processor, the HLS tool configured to generate a register-transfer level (RTL) description of an integrated circuit, the HLS tool comprising:
- a library processing module configured to define a library component based on a first RTL defining an element of the integrated circuit, the library component including:
  - an input interface associated with the element of the integrated circuit, the input interface being configured to map at least one input variable to a first memory location, and
  - an output interface associated with the element of the integrated circuit, the output interface being configured to map at least one output variable to a second memory location, and
- a synthesis module configured to,
  - replace a portion of a source code corresponding to a first program model with the library component, the source code defining the integrated circuit, and
  - generate the RTL description of the integrated circuit based on the source code.

11. The HLS tool of claim 10, wherein the input interface and the output interface are hardware interfaces defined in a high level programming language.

12. The HLS tool of claim 10, wherein the synthesis module is further configured to, when interfacing with the library component, generate an output in a same clock cycle as a received input during the generation of the RTL description of the integrated circuit.

13. The HLS tool of claim 10, wherein the synthesis module is further configured to, when interfacing with the library component, write an output to a first memory location in a same clock cycle as reading an input from a second memory location.

14. A method for designing an integrated circuit using a high-level synthesis (HLS) tool, the method comprising:
  defining, by a synthesis tool module, a library component based on a first register-transfer level (RTL) configured to define an element of the integrated circuit,
  replacing, by the synthesis tool module, a portion of a source code corresponding to a first program model with the library component, the source code defining the integrated circuit, and
  generating, by the synthesis tool module, a second RTL description representing the integrated circuit based on the source code, wherein during the generating of the second RTL description, an output is written to a first memory location in a same clock cycle as reading an input from a second memory location.

15. The method of claim 14, wherein the first program model defines a state machine including multiplexer logic.

16. The method of claim 14, wherein the first program model defines an arithmetic decoder.

17. The method of claim 14, further comprising:
  defining an input interface associated with the element of the integrated circuit, the input interface being configured to map at least one input variable to the first memory location, and
  defining an output interface associated with the element of the integrated circuit, the output interface being configured to map at least one output variable to the second memory location.

18. The method of claim 14, wherein the generating of the second RTL description includes writing an output to a first memory location in a same clock cycle as reading an input from a second memory location when interfacing with the library component.

19. The method of claim 14, further comprising:
  defining an input hardware interface associated with the element of the integrated circuit, the input hardware interface being defined in a high level programming language, and
  defining an output hardware interface associated with the element of the integrated circuit, the output hardware interface being defined in the high level programming language.

* * * * *